United States Patent
Iwata (10) Patent No.: US 10,228,522 B2
(45) Date of Patent: Mar. 12, 2019

(54) BONDING METHOD, METHOD OF PRODUCING OPTICAL MODULE, AND OPTICAL MODULE

(71) Applicant: FUJIKURA LTD., Tokyo (JP)

(72) Inventor: Koichiro Iwata, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/508,627

(22) PCT Filed: May 10, 2016

(86) PCT No.: PCT/JP2016/063895
§ 371 (c)(1),
(2) Date: Mar. 3, 2017

(87) PCT Pub. No.: WO2017/029842
PCT Pub. Date: Feb. 23, 2017

(65) Prior Publication Data
US 2017/0276871 A1    Sep. 28, 2017

(30) Foreign Application Priority Data

Aug. 20, 2015 (JP) ................................. 2015-163146

(51) Int. Cl.
| | |
|---|---|
| *G02B 6/42* | (2006.01) |
| *H01L 33/48* | (2010.01) |
| *G02B 7/00* | (2006.01) |
| *G02B 26/08* | (2006.01) |

(Continued)

(52) U.S. Cl.
CPC ......... *G02B 6/4201* (2013.01); *G02B 6/4257* (2013.01); *G02B 6/4259* (2013.01);
(Continued)

(58) Field of Classification Search
CPC .. G02B 6/4201; G02B 6/4219; G02B 6/4257; G02B 6/4259; G02B 6/426; H01L 33/48;
(Continued)

(56) References Cited

U.S. PATENT DOCUMENTS

| | | | | |
|---|---|---|---|---|
| 6,023,339 | A | * | 2/2000 | Haugsjaa ............. G02B 6/4219 356/401 |
| 6,069,027 | A | * | 5/2000 | Mertol .................... H01L 21/50 257/E21.499 |

(Continued)

FOREIGN PATENT DOCUMENTS

| | | |
|---|---|---|
| JP | 2006-128514 A | 5/2006 |
| JP | 2007-206337 A | 8/2007 |

(Continued)

OTHER PUBLICATIONS

International Search Report dated Aug. 2, 2016, issued in counterpart International Application No. PCT/JP2016/063895 (2 pages).

(Continued)

*Primary Examiner* — Robert Tavlykaev
(74) *Attorney, Agent, or Firm* — Westerman, Hattori, Daniels & Adrian, LLP (57) ABSTRACT

Realized is a bonding method which makes it possible to cause an angle formed between a front surface of an optical element and an upper end surface of a housing side wall to accurately match a design objective value. The bonding method includes the steps of (a) placing an optical element (12) on a jig (2) so that a front surface (12a) of the optical element (12) is in surface contact with a first flat surface (23a) of the jig (2); and (b) placing a housing (11) on the jig (2) so that (i) an upper end surface (11a1) of a side wall (11a) of the housing (11) is in surface contact with a second flat surface (21a) of the jig (2) and (ii) a bottom plate (11b) of the housing (11) is in contact with a back surface (12b) of the optical element (12) via an adhesive (15).

17 Claims, 6 Drawing Sheets

(51) Int. Cl.
*H01L 31/02* (2006.01)
*H01L 31/0203* (2014.01)
*H01S 5/022* (2006.01)

(52) U.S. Cl.
CPC .............. *H01L 33/486* (2013.01); *G02B 7/00* (2013.01); *G02B 26/08* (2013.01); *H01L 31/02* (2013.01); *H01L 31/0203* (2013.01); *H01L 2224/16225* (2013.01); *H01S 5/02296* (2013.01)

(58) Field of Classification Search
CPC . H01L 33/483; H01L 33/486; H01L 2924/15; H01L 2924/151; H01L 2225/06513
USPC ............... 385/88–92, 134; 438/108; 257/778
See application file for complete search history.

(56) References Cited

U.S. PATENT DOCUMENTS

| | | | | |
|---|---|---|---|---|
| 6,810,736 B2* | 11/2004 | Ikezawa | ................. | G01P 1/006 257/415 |
| 6,964,804 B2* | 11/2005 | Steinberg | ............. | G02B 6/4204 216/2 |
| 7,892,882 B2* | 2/2011 | Leal | ........................ | H01L 23/36 257/678 |
| 2002/0063324 A1* | 5/2002 | Shiina | ................... | H01L 21/563 257/690 |
| 2003/0034438 A1* | 2/2003 | Sherrer | ................ | G02B 6/4231 250/216 |
| 2007/0189676 A1 | 8/2007 | Nagasaka | | |
| 2008/0102544 A1 | 5/2008 | Okada et al. | | |

FOREIGN PATENT DOCUMENTS

| | | |
|---|---|---|
| JP | 2008-108992 A | 5/2008 |
| JP | 2011-164222 A | 8/2011 |

OTHER PUBLICATIONS

Office Action dated Jul. 3, 2018, issued in counterpart Chinese Application No. 201680002469.6, with English translation. (17 pages).

* cited by examiner

Cross section viewed along arrows A-A

FIG. 2

Cross section viewed along arrows A-A

BONDING METHOD, METHOD OF PRODUCING OPTICAL MODULE, AND OPTICAL MODULE

TECHNICAL FIELD

The present invention relates to a bonding method of bonding an optical element to a housing. The present invention further relates to a method of producing an optical module by use of such a bonding method. The present invention further relates to an optical module suitable for such a production method.

BACKGROUND ART

There have been widely known optical modules each including a housing and an optical element fixed to a bottom plate of the housing. For example, Patent Literature 1 discloses an optical module (referred to as an "optical semiconductor device" in Patent Literature 1) including a housing having a box shape, an optical element fixed to a bottom plate of the housing, and a lid covering opening of the housing and having a window.

Such an optical module state where the optical module, is mounted on various optical Examples of are optical device on which an optical module is mounted include an optical device (referred to as an "optical module" in Patent Literature 9) disclosed in Patent Literature 2. Patent Literature 2 discloses that an optical module (referred to as an "optical element package" in Patent Literature 2) is mounted on the optical device so that an upper surface of the optical module is parallel to a surface of a substrate included in the optical device. As a method of mounting the optical module on the optical device, Patent Literature 2 discloses a method in which the optical module whose upper surface is absorbed by an absorption head is soldered to the substrate in a state where the absorption head is lowered so that legs extending from the absorption head are in contact with the surface of the substrate.

CITATION LIST

Patent Literature

[Patent Literature 1]
Japanese Patent Application Publication Tokukai No. 2006-128514 (Publication date: May 18, 2006)
[Patent Literature 2]
Japanese Patent Application Publication Tokukai No. 2008-108992 (Publication date: May 8, 2008)

SUMMARY OF INVENTION

Technical Problem

As a method of mounting an optical module on an optical device, a normal mounting technique or a flip-chip mounting technique is used. The normal mounting technique indicates that a lower surface of an optical module (specifically, a lower surface of a bottom plate (housing bottom plate) of a housing) is fixed to a surface (mounting surface) of an optical device on which surface the optical module is to be mounted. Meanwhile, the flip-chip mounting technique indicates that an upper surface of an optical module (specifically, an upper end surface of a side wall (housing side wall) of a housing) is fixed to a mounting surface of an optical device. In each of (i) a case where the normal mounting technique is used and (ii) a case where the flip-chip mounting technique is used, an angle formed between a mounting surface of an optical device and a front surface (surface on which an effective region such as a reflecting region is formed) of an optical element is an important factor which affects performance of the optical device. In a case where the angle formed between the mounting surface of the optical device and the front surface of the optical element does not match a design objective value, light enters the optical element front a direction different from an intended direction or light is emitted front the optical element to a direction different from an indented direction. This does not allow the optical element to bring about its original performance.

In a case where an optical module is flip-chip mounted on an optical device, it is important to cause an angle formed between an upper end surface (surface fixed to a moue ting surface of an optical device) of a housing side wall and a front surface of an optical element to highly accurately match a design objective value. For example, it is important to cause the upper end surface of the housing side wall to be highly accurately parallel to the front surface of the optical element (in a case where the design objective value is 0°). In a case where such accuracy is low, the angle formed between the front surface of the optical element and the mounting surface of the optical device does not match the design objective value even in a case where the upper end surface of the housing side wall is suitably fixed to the mounting surface of the optical device.

However, a demand that the upper end surface of the housing side highly accurately parallel to the front surface. Of the optical element has conventionally been a demand which is difficult to respond to. This is because strict conditions (such as flatness of the upper end surface of the housing side wall, parallelism between the upper end surface of the housing side wall and a lower end surface of the housing side wall, flatness of an upper surface of a housing bottom plate, parallelism between the front surface of the optical element and a back surface of the optical element, and flatness of the front surface of the optical element) are imposed on a shape of a housing 11 and on a shape of the optical element 12 so that the demand is responded to. In particular, in a case where the housing is made of ceramic, it is difficult to satisfy those conditions due to, for example, warpage of the housing during sintering.

Note that, in a case where the method (method of mounting the optical module on the optical device) disclosed in Patent Literature 2 is used, it is possible to bond and fix the optical element to the housing bottom plate so that the upper end surface of the housing side wall is parallel to the front surface of the optical element. That is, it is possible to cause the upper end surface of the housing side wall to be parallel to the front surface of the optical element by employing a bonding method of bonding the optical element, whose upper surface is absorbed by the absorption head, to the housing bottom plate in a state where the absorption head is lowered so that the legs extending from the absorption head are in contact with the upper end surface of the housing side wall.

However, such a bonding method is not suitable for mass-production of optical modules for the following reasons. Specifically, a mounting device including an absorption head as described above is expensive. Therefore, in a case where a large number of such mounting devices are prepared, this results in a considerable increase in cost of producing optical modules. Accordingly, in a case where a large number of optical modules are mass-produced, it is not possible to simultaneously produce the large number of optical modules in parallel with use of a large number of mounting devices. This does not allow an increase in amount of production of the optical modules per unit of time.

The present invention has been made in view of the above problems and an object of the present invention is to realize a bonding method of bonding an optical element and a housing, which constitute an optical module, to each other, the bonding method allowing an angle formed between a front surface of the optical element and an upper end surface of a housing side wall to accurately match a design objective value.

Solution to Problem

In order to attain the above object, a bonding method in accordance with the present invention is a bonding method of bonding a back surface of an optical element to a bottom plate of a housing with use of a jig which has a first flat surface and a second flat surface, the bonding method including the steps of: (a) placing the optical element on the jig so that a front surface of the optical element is in surface contact with the first flat surface of the jig; (b) placing the housing on the jig so that (i) a first end surface of a side wall of the housing is in surface contact with the second flat surface of the jig, the first end surface being opposite to a second end surface of the side wall which second end surface is joined to the bottom plate of the housing, and (ii) the bottom plate of the housing is in contact with the back surface of optical element via an adhesive; and (c) curing the adhesive in a state where the optical element and the housing are placed on the jig.

According to the above method, it is possible to cause an angle formed between the front surface of the optical element and the first end surface (which is opposite to the second end surface of the side wall which second end surface is joined to the bottom plate of the housing) of the side wall of the housing in the optical module after bonding to accurately match an angle formed between the first flat surface and the second flat surface in the jig. Therefore, by casing the angle formed between the first flat surface and the second flat surface in the jig to match a design objective value which is set in advance, it is possible to cause the angle formed between the front surface of the optical element and the first end surface of the side wall of the housing in the optical module to match the design objective value.

In order to attain the above object, a production method in accordance with the present invention is a method of producing an optical module, the method including the step of bonding a back surface of an optical element to a bottom plate of a housing by use of the foregoing bonding method.

According to the above method, it is possible to bring about an effect similar to that brought about by the foregoing bonding method.

In order to attain the object, an optical module in accordance with the present invention is an optical module including: a housing which includes a bottom plate; an optical element which has a back surface bonded to the bottom plate of the housing; and an elastic body which is sandwiched between the bottom plate of the housing and the back surface of the optical element in a state where the elastic body is compressed.

According to the above configuration, it is possible to bring about an effect similar to that brought about by the foregoing bonding method.

Advantageous Effects of Invention

According to the present invention, it is possible to cause an angle formed between a front surface of an optical element and an end surface of a housing side wall in an optical module after bonding to accurately match a design objective value.

BRIEF DESCRIPTION OF DRAWINGS (a) of FIG. 1 is a perspective view illustrating an appearance of an optical module which is produced by a bonding method illustrated in FIG. 3. (b) of FIG. 1 is a cross-sectional view illustrating the optical module, viewed along arrows A-A.

(a) of FIG. 2 is a perspective view illustrating an appearance of a jig used in the bonding method illustrated in FIG. 3. (b) of FIG. 2 is a cross-sectional view illustrating the jig, viewed along arrows A-A.

(a) of FIG. 7 is a perspective view illustrating Variation 3 of the jig illustrated in FIG. 2. (b) of FIG. 7 is a cross-sectional view illustrating the jig, viewed along arrows B-B.

(a) of FIG. 8 is a perspective view illustrating Variation 4 of the jig illustrated in FIG. 2. (b) of FIG. 8 is a cross-sectional view illustrating the jig, viewed along arrows B-B.

DESCRIPTION OF EMBODIMENTS

[Optical Module]

Figure 1:
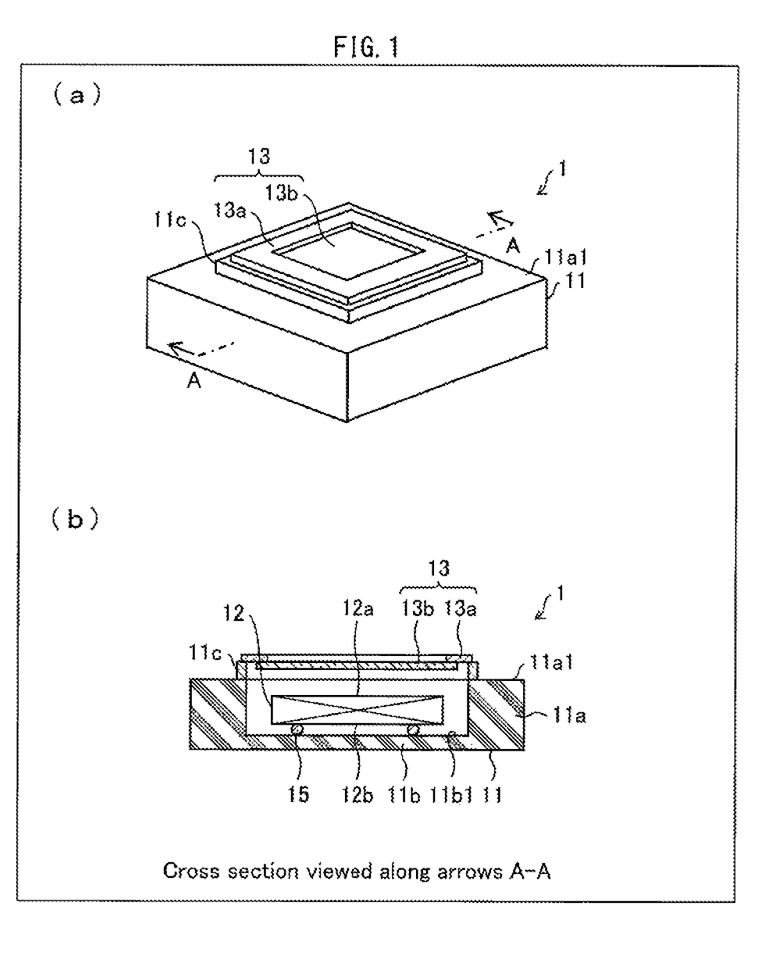

The following description will first discuss, with reference to FIG. 1, an optical module 1 which is produced by use of a bonding method in accordance with the present embodiment. (a) of FIG. 1 is a perspective view illustrating an appearance of the optical module 1. (b) of FIG. 1 is a cross-sectional view illustrating the optical module 1, viewed along arrows A-A.

As illustrated in FIG. 1, the optical module 1 includes a housing 11, an optical element 12 which is stored in the housing 11, and a lid 13 which, together with the housing 11, seals the optical element 12 in.

The housing 11 is a member in which the optical element 12 is stored. The housing 11 includes (i) a side wall 11a which has a tubular shape and (ii) a bottom plate 11b which has an upper surface whose outer periphery is joined to a lower end surface of the side wall 11a.

In the present embodiment, the housing 11 which has the bottom plate 11b having a rectangular shape and which accordingly has a rectangular cup shape is used (see (a) of FIG. 1). Note, however, that the housing 11 is not limited to such a shape. That is, the bottom plate 11b can have any shape. For example, the housing 11 which has the bottom plate 11b having a circular shape and which accordingly has a barrel shape can be used. Furthermore, in the present embodiment, the housing 11 which is configured such that the side wall 11a and the bottom plate 11b are each made of ceramic and are integrally formed is used (see (b) of FIG. 1). Note, however, that the housing 11 is not limited to such a configuration. That is, the side wall 11a and the bottom plate 11b can be separately formed. Furthermore, the side wall 11a and the bottom plate 11b can be each made of a material, such as metal, other than ceramic.

The optical element 12 is an element having an optical function such a reflecting function, a light receiving function, or a light emitting function. The optical element 12 has an effective region on its front surface 12a. Note, here, that the effective region indicates a region of the optical element 12 which region carries out the optical function, e.g., a reflecting region of a reflecting element, a light receiving region of a light receiving element, or a light emitting region of a light emitting element. The optical element 12 is bonded to and fixed to a housing bottom plate 11b (indicating the bottom plate 11b of the housing the same in the following description). More specifically, a back surface 12b of the optical element 12 is bonded to and fixed to the upper surface 11b1 of the housing bottom plate 11b with use of an adhesive 15. Examples of the adhesive 15 include a two-component room-temperature-setting resin and a thermosetting resin which is curable at a temperature lower than a heat-resistant temperature of the optical element 12. The optical element 12 is connected, via a wire (not illustrated), to an electrode which passes through the housing 11. This allows an electric signal to be supplied to the optical element 12 from outside, and allows an electric signal to be supplied outside from the optical element 12.

In the present embodiment, an LCOS (Liquid Crystal On Silicon) element, which is a reflecting element, is employed as the optical element 12. Note, however, that the optical element 12 is not limited to an LCOS element. For example, another reflecting element such as an MEMS (Micro Electro Mechanical System) element can be alternatively employed as the optical element 12. Alternatively, a light emitting element such as an LD (Laser Diode) can be employed as the optical element 12. Alternatively, a light receiving element such as a PD (Photo Diode) can be employed as the optical element 12.

The lid 13 is a member which covers opening of the housing 11. The lid 13 includes (i) a frame part 13a which has a plate shape and which has an opening at its center and (ii) a window part 13b which has a plate shape and which has an upper surface whose outer periphery is joined to a lower surface of the frame part 13a so that the window part 13b covers the opening of the frame part 13a. The window part 13b is made of a transparent material such as borosilicate glass. As such, the window part 13b causes light to pass therethrough so that the light enters the optical element 12 or causes light emitted from the optical element 12 to pass therethrough. The lid 13 has a size smaller than that of the housing 11, as viewed from above. The lid 13 is attached to the housing 11 by joining the lower surface of the frame part 13a to an inner periphery side of an upper end surface 11a1 of a housing side wall 11a (indicating the side wall 11a of the housing 11, the same in the following description). In so doing, an outer periphery side of the upper end surface 11a1 of the housing side wall 11a is exposed without being covered with the lower end surface of a lid frame part 13a (indicating the frame part 13a of the lid 13, the same in the following description).

Note that, in the present embodiment, the lid 13 (the frame part 13a of the lid 13) is joined to the housing side wall 11a by seam welding. For this reason, the frame part 13a of the lid 13 is made of metal, and is made thin (in the present embodiment, although the whole of the frame part 13a is made thin, merely an outer periphery of the frame part 13a can be alternatively made thin). To the upper end surface 11a1 of the housing side wall 11a, a frame part 11c made of metal is fixed in advance (by, for example, brazing). The seam welding of the lid 13 to the housing side wall 11a is achieved by causing a electric current to pass through respective boundary surfaces of the frame part 13a of the lid 13 and the frame part 11c of the housing side wall 11a in a state where the frame part 13a of the lid 13 is in contact with the frame part 11c of the housing side wall 11a.

By the way, the optical module 1 is a so-called "flip-chip mounted optical module," that is, the optical module 1 is flip-chip mounted on an optical device serving as a host. Note, here, that a flip-chip mounting technique indicates that (i) the optical module 1 is turned upside down from a state illustrated in FIG. 1 and (ii) the optical module 1 is mounted on an optical device so that the upper end surface 11a1 of the housing side wall 11a of the optical module 1 is in surface contact with a surface (mounting surface) of the optical device on which surface the optical module 1 is to be mounted.

In a case where the optical module 1 is flip-chip mounted on the optical device, a direction, in a coordinate system, of the front surface 12a of the optical element 12 included in the optical module 1 which is fixed to the optical device is determined by an angle formed between the upper end surface 11a1 of the housing side wall 11a and the front surface 12a of the optical element 12. Therefore, according to the optical module 1, the angle formed between the upper end surface 11a1 of the housing side wall 11a and the front surface 12a of the optical element 12 is an important factor which affects an optical characteristic of the optical device. Therefore, it is required to cause the angle formed between the upper end surface 11a1 of the housing side wall 11a and the front surface 12a of the optical element 12 to accurately match a design objective value (0° in the present embodiment), in a bonding step of bonding the optical element 12 to the housing bottom plate 11b, which bonding step is carried out during production of the optical module 1. The bonding method in accordance with the present embodiment has been devised so as to fulfill such a requirement (later described).

Note that, in the present embodiment, it is assumed that the optical module 1 is flip-chip mounted on the optical device so that four sides of the upper end surface 11a1 of the housing side wall 11a are in surface contact with the mounting surface of the optical device. However, the present invention is not limited to such a case. That is, the present invention is applicable to a case where the optical module 1 is flip-chip mounted on the optical device so that any part of the upper end surface 11a1 of the housing side wall 11a is in surface contact with the mounting surface of the optical device.

For example, the present invention is applicable to a case where the optical module 1 is flip-chip mounted on the optical device so that two (two sides which are parallel to each other or two sides which are perpendicular to each other) or three of the four sides of the upper end surface 11a1 of the housing side wall 11a are in surface contact with the mounting surface of the optical device. In a case where the upper end surface 11a1 of the housing side wall 11a is uneven, the present invention is applicable to a case where the optical module 1 is flip-chip mounted on the optical device so that an upper surface of a protrusion is in surface contact with the mounting surface of the optical device or so that a bottom surface of a depression is in surface contact with the mounting surface of the optical device. Note, however, that, in order to stably flip-chip mount the optical module 1 on the optical device (or in order to stably place the housing 11 on a jig 2 (later described)), it is preferable that a region of the upper end surface 11a1 of the housing side wall 11a which region is in surface contact with the mounting surface of the optical device surrounds a center of gravity of the optical module 1.

In the present embodiment, the optical module 1 is configured such that the housing 11 and the lid 13 seal the optical element 12 in. However, the present invention is not limited to such a configuration. For example, in a case where the optical element 12 and the adhesive 15, which causes the optical element 12 to be bonded to and fixed to the housing bottom plate 11b, are sufficiently resistant to outside atmosphere, the lid 13 can be omitted. Moreover, in a case where optical module 1 is mounted on the optical device and then the optical device is, in whole, hermetically sealed in, the lid 13 can be omitted.

[Method of Producing Optical Module]

Next, a method of producing the optical module 1 by use of the bonding method in accordance with an embodiment of the present invention will be described below with reference to FIGS. 2 and 3.

The method of producing the optical module 1 includes (1) the bonding step of bonding the optical element 12 to the housing bottom plate 11b and (2) a joining step of joining the lid frame part 13a to the housing side wall 11a. In the bonding step, the jig 2 which is special is used. Therefore, the jig 2 will be first described below, and then the bonding method carried out with use of the jig 2 will be described below.

Figure 2:
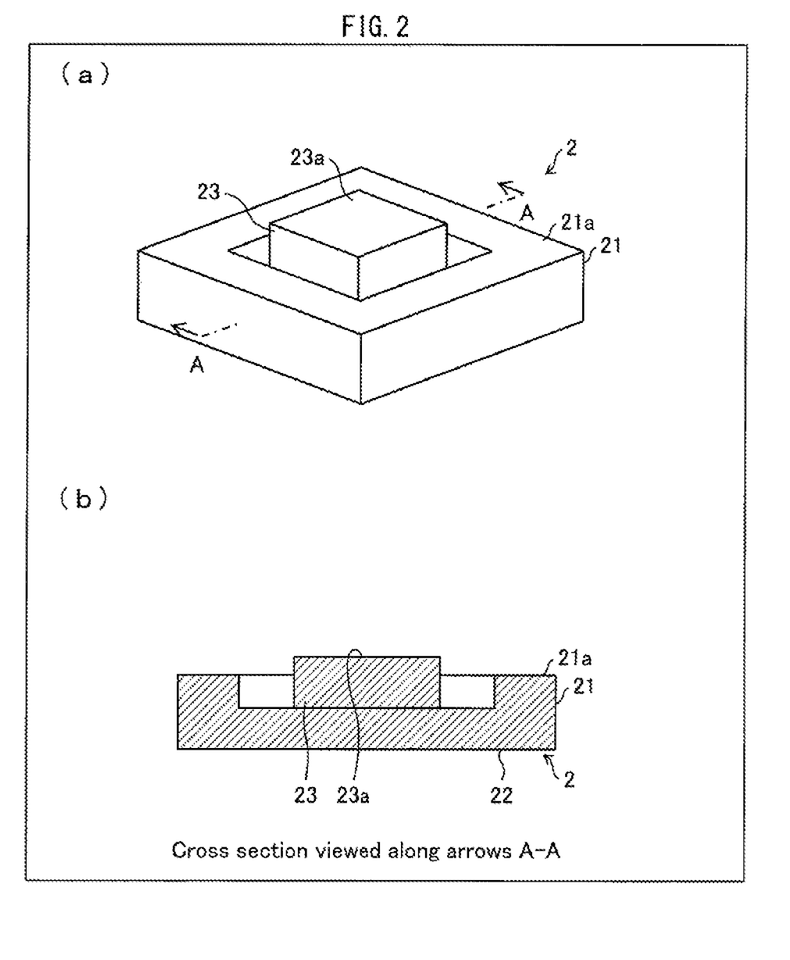

(a) of FIG. 2 is a perspective view illustrating an appearance of the jig 2. (b) of FIG. 2 is a cross-sectional view illustrating the jig 2, viewed along arrows A-A.

The jig 2 is a member on which the optical element 12 is placed in the bonding step. The jig 2 includes (i) a tubular part 21, (ii) a bottom plate 22 which has an upper surface whose outer periphery is joined to a lower end surface of the tubular part 21, and (iii) a columnar part 23 which is surrounded by the tubular part 21 and which has a lower end surface joined to the bottom plate 22.

Each of an upper end surface (first flat surface) 23a of the columnar part 23 and an upper end surface (second flat surface) 21a of the tubular part 21 is made flat. An angle formed between the upper end surface 23a of the columnar part 23 and the upper end surface 21a of the tubular part 21 matches the design objective value (0° in the present embodiment) of the angle formed between the upper end surface Hal of the housing side wall 11a and the front surface 12a of the optical element 12. Further, a difference between (i) a height of the upper end surface 21a of the columnar part 23 (distance from the upper surface of the bottom plate 22 to the upper end surface 23a) and (ii) a height of the upper end surface 21a of the tubular part 21 (distance from the upper surface of the bottom plate 22 to the upper end surface 21a) matches a difference between (i) a height of the front surface 12a of the optical element 12 (distance from a bottom plate upper surface 11b1 to the front surface 12a) and (ii) a height of the upper end surface 11a1 of the housing side wall 11a (distance from the bottom plate upper surface 11b1 to the upper end surface 11a1).

A space is provided between the columnar part 23 and the tubular part 21 so that, in a case where the housing 11 is placed on the jig 2, the frame part 11c provided on the upper end surface 11a1 of the housing side wall 11a does not interfere with any of the columnar part 23 and the tubular part 21. Note that, in a case here the housing 11 does not include the frame part 11c, the space does not need to be provided.

Note that the upper end surface 23a of the columnar part 23 and the upper end surface 21a of the tubular part 21 can be each formed by, for example, milling. In this case, the upper end surface 23a of the columnar part 23 and the upper end surface 21a of the tubular part 21 can be each formed by pressing a milling cutter from above against the jig 2 which is fixed to a milling machine so that the bottom plate 22 is in contact with a stage of the milling machine. Therefore, it is possible to carry out, as a series of steps, (i) a step of milling the upper end surface 23a of the columnar part 23 with use of the milling cutter and (ii) a step of milling the upper end surface 21a of the tubular part 21 with use of the milling cutter, without carrying out, between those steps, a step of re-fixing the jig 2 to the milling machine. This allows highly accurate parallelism to be realized between the upper end surface 23a of the columnar part 23 and the upper end surface 21a of the tubular part 21.

Figure 3:
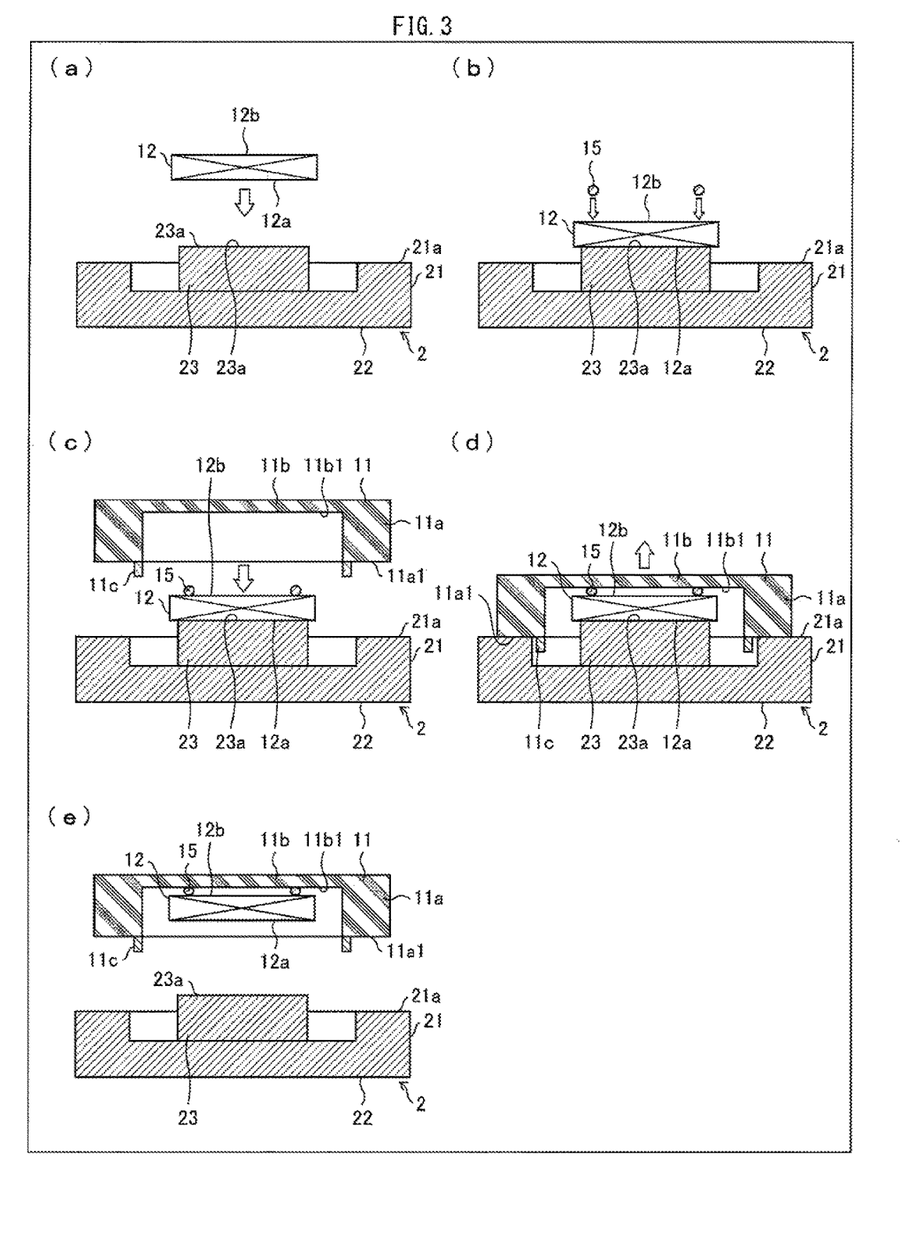
FIG. 3 is a view explaining the bonding method in accordance with an embodiment of the present invention.

FIG. 3 is a view illustrating the bonding method in accordance with an embodiment of the present invention, that is, the bonding method of bonding the optical element 12 to the housing bottom plate 11b with use of the jig 2.

First, as illustrated in (a) of FIG. 3, the optical element 12 is placed on the jig 2. In so doing, the optical element 12 is placed on the jig 2 so that the front surface 12a of the optical element 12 is in surface contact with the upper end surface 23a of the columnar part 23. Since the optical element 12 is pressed against the jig 2 by gravity, such surface contact is stably maintained in subsequent steps.

Next, as illustrated in (b) of FIG. 3, the adhesive 15 is applied to the back surface 12b of the optical element 12. Note that, instead of applying the adhesive 15 to the back surface 12b of the optical element 12, the adhesive 15 can be applied to the upper surface 11b1 of the housing bottom plate 11b. The adhesive 15 is preferably curable at a temperature lower than the heat-resistant temperature of the optical element 12.

Next, as illustrated in (c) of FIG. 3, the housing 11 is placed on the jig 2. In so doing, the housing 11 is placed on the jig 2 so that (i) the upper end surface 11a1 of the housing side wall 11a is in surface contact with upper end surface 21a of the tubular part 21 and (ii) the upper surface 12b1 of the housing bottom plate 11b is in contact with the back surface 12b of the optical element 12 via the adhesive 15. Since the housing 11 is pressed against the jig 2 by gravity, such surface contact is stably maintained in subsequent steps.

Subsequently, as illustrated in (d) of FIG. 3, the adhesive 15 is cured in a state where the optical element 12 and the housing 11 are placed on the jig 2 so that the back surface 12b of the optical element 12 is bonded to and fixed to the upper surface 11b1 of the housing bottom plate 11b. The adhesive 15 can be cured by a method selected in accordance with a type of a resin used as the adhesive 15. In a case where the adhesive 15 is a room-temperature-setting resin, the adhesive 15 is left to stand still until the adhesive 15 is cured at a room temperature. In a case where the adhesive 15 is a thermosetting resin, the adhesive 15 is heated at a temperature for a time period, each necessary to cure the adhesive 15, with use of an appropriate heating apparatus such as an oven or a hot plate.

Finally, as illustrated in (e) of FIG. 3, the housing 11 to which the optical element 12 is bonded is removed from the jig 2. Bonding of the optical element 12 to the housing bottom plate 11b is thus completed.

According to the above bonding method, it is possible to cause the angle formed between the front surface 12a of the optical element 12 and the upper end surface 11a1 of the housing side wall 11a in the optical module 1 after bonding to accurately match the angle formed between the upper end surface 23a of the columnar part 23 and the upper end surface 21a of the tubular part 21 in the jig 2. Therefore, by causing the angle formed between the upper end surface 23a of the columnar part 23 and the upper end surface 21a of the tubular part 21 in the jig 2 to match the design objective value (0° in the present embodiment) which is set in advance, it is possible to cause the angle formed between the front surface 12a of the optical element 12 and the upper end surface 11a1 of the housing side wall 11a in the optical module 1 after bonding to accurately match the design objective value (±0.1° in the present embodiment).

Furthermore, since the jig 2 includes a small number of components and has a simple structure, it is possible to produce the jig 2 inexpensively. Therefore, even in a case where a large number of jigs 2 are produced, this does not result in a considerable increase in cost of producing optical modules 1. For this reason, in a case where a large number of optical modules 1 are mass-produced, it is preferable to simultaneously produce the large number of optical modules 1 in parallel with use of a large number of jigs 2 (in particular, it is preferable to simultaneously carry out the bonding step of bonding the optical element 12 to the housing bottom plate 11b). This allows an increase in amount of production of the optical modules 1 per unit of time, even in a case where a resin which takes long time to be cured is used as the adhesive 15.

[Variation of Optical Module]

Figure 4:
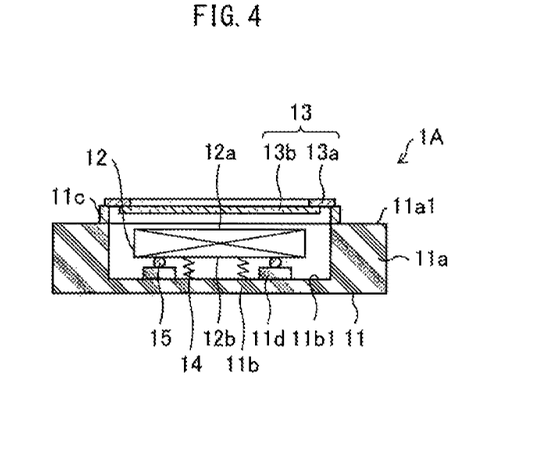
FIG. 4 is a cross-sectional view illustrating a variation of the optical module illustrated in FIG. 1.

Next, the following description will discuss, with reference to FIG. 4, a Variation of the optical module 1 illustrated in FIG. 1. FIG. 4 is a cross-sectional view of an optical module 1A in accordance with the present Variation.

As illustrated in FIG. 4, the optical module 1A in accordance with the present Variation includes an elastic body 14 and a spacer 11d in addition to the members of the optical module 1 illustrated in FIG. 1. Members other than the elastic body 14 and the spacer 11d are similar, in configuration, to the respective corresponding members of the optical module 1. Therefore, the members other than the elastic body 14 and the spacer 11d will be given respective reference signs identical to those of the respective corresponding members of the optical module 1, and description of the members will be omitted.

The elastic body 14 is sandwiched between an upper surface 11b1 of a housing bottom plate 11b and a back surface 12b of an optical element 12 in a state where the elastic body 14 is compressed. The elastic body 14 only needs to have such a Young's modulus that the elastic body 14 is elastically compressed by a weight of a housing 11. Examples of the elastic body 14 include a spring, rubber, and a sponge.

The spacer 11d is a columnar member, and is provided on the upper surface 11b1 of the housing bottom plate 11b. The spacer 11d is used to adjust, to a given value, a difference between a height of a front surface 12a of the optical element 12 (distance from the upper surface 11b1 of the housing bottom plate 11b to the front surface 12a of the optical element 12) and a height of an upper end surface 11a1 of a housing side wall 11a (distance from the upper surface 11b1 of the housing bottom plate 11b to the upper end surface 11a1 of the housing side wall 11a). An adhesive 15 is applied to an upper surface of the spacer 11d.

A method of producing the optical module 1A is different from the method of producing of the optical module 1 in that, in a step of placing the housing 11 on a jig 2, the housing 11 is placed on the jig 2 so that the elastic body 14 which is compressed is sandwiched between the upper surface 11b1 of the housing bottom plate 11b and the back surface 12b of the optical element 12. However, in the other points, the method of producing the optical module 1A is identical to the method of producing the optical module 1.

With the method, the optical element 12 is pressed against the jig 2 by, in addition to gravity acting on the optical element 12, a force applied by the elastic body 14, in the step of placing the housing 11 on the jig 2 and in subsequent steps. Therefore, even in a case where the optical element 12 is pulled up by a surface tension of the adhesive 15, it is possible to cause the front surface 12a of the optical element 12 to be absolutely in surface contact with an upper end surface 23a of a columnar part 23.

[Variation 1 of Jig]

Figure 5:
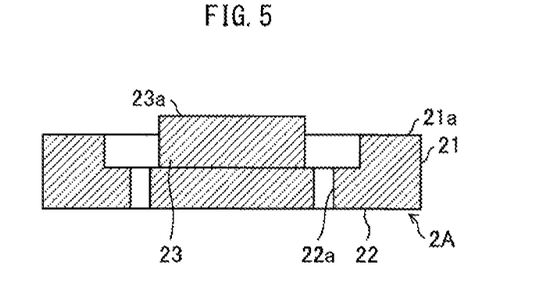
FIG. 5 is a cross-sectional view illustrating Variation 1 of the jig illustrated in FIG. 2.

The following description will discuss, with reference to FIG. 5, Variation 1 of the jig 2 illustrated in FIG. 2. FIG. 5 is a cross-sectional view of a jig 2A in accordance with the Variation 1.

As illustrated in FIG. 5, the jig 2A in accordance with Variation 1 is obtained by forming 22a in the bottom plate 22 of the jig 2 illustrated in FIG. 2. Members other than the opening 22a are similar, in configuration, to the respective corresponding members of the jig 2. Therefore, the members other than the opening 22a will be given respective reference signs identical to those of the respective corresponding members of the jig 2, and description of the members will be omitted.

Since the jig 2A has a bottom plate 22 which has the opening 22a, it is possible to optically observe a position of a housing 11 and a position of an optical element 12 even after the housing 11 is placed on the jig 2A (light passing through the opening 22a is used to optically observe the position of the optical element 12). The opening 22a is preferably formed at such a position that, for example, a corner or an alignment mark of the housing 11 and a corner or an alignment mark of the optical element 12 can be visually observed from outside through the opening 22. This makes it possible to adjust the position of the housing 11 relative to the jig 2 while the position of the optical element 12 relative to the housing 11 is being optically observed, between when the housing 11 is placed on the jig 2A and when an adhesive 15 is cured.

[Variation 2 of Jig]

Figure 6:
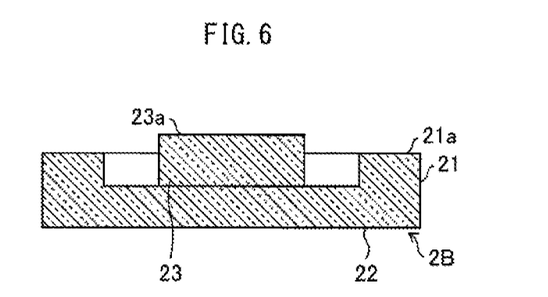
FIG. 6 is a cross-sectional view illustrating Variation 2 of the jig illustrated in FIG. 2.

The following description will discuss Variation 2 of the jig 2 with reference to FIG. 6. FIG. 6 is a cross-sectional view of a jig 2B in accordance with Variation 2.

As illustrated in FIG. 6, the jig 2B in accordance with of Variation 2 is obtained by replacing a material of each of the members of the jig 2 illustrated in FIG. 9 with a transparent material.

Since the jig 2B is made of a transparent material, it is possible to optically observe a position of a housing 11 and position of an optical element 12 even after the housing 11 is placed on the jig 2B (light passing through the jig 2B is used to optically observe the position of the optical element 12). This makes it possible to adjust the position of the housing 11 relative to the jig 2 while the position of the optical element 12 relative to the housing 11 is being optically observed, between when the housing 11 is placed on the jig 2A and when an adhesive 15 is cured.

The transparent material of which the jig 2B is made is a material having a sufficiently high transmittance with respect to a wavelength of light used for the aforementioned optical observation. Note, however, that the transparent material is preferably a material which does not deteriorate (for example, a material which does not deform) at a temperature at which the adhesive 15, which causes the optical element 12 to be bonded to and fixed to a housing bottom plate 11b, is cured.

[Variation 3 of Jig]

Figure 7:
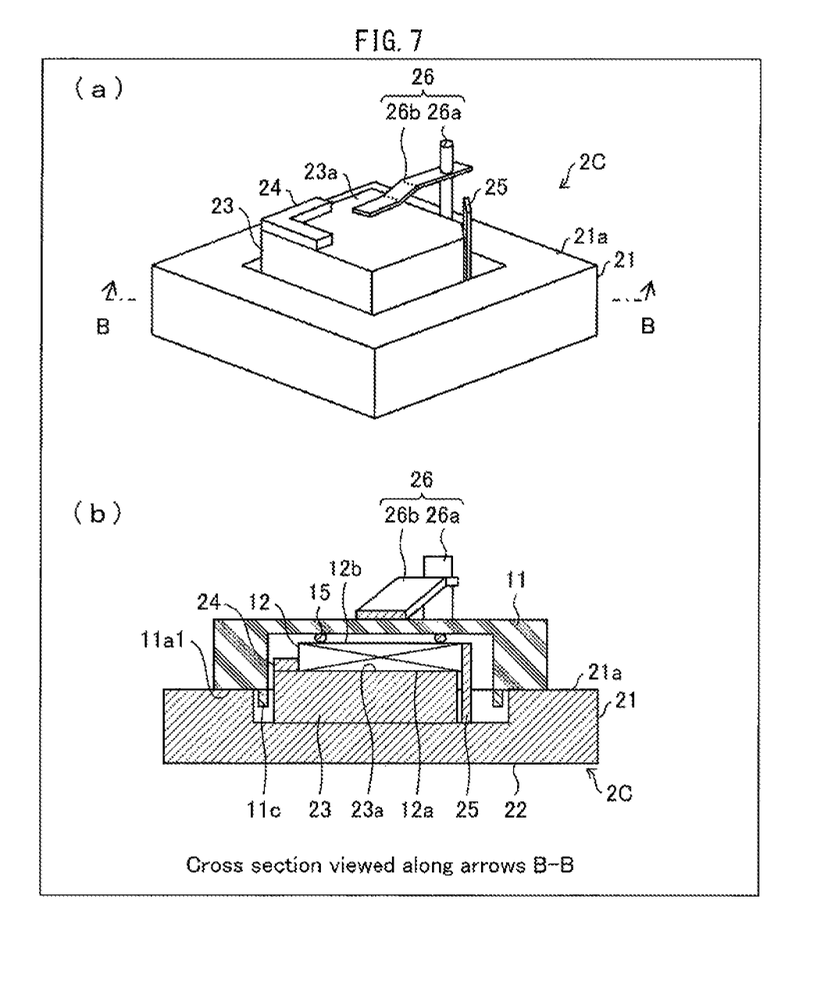

The following description will discuss Variation 3 of the jig 2 with reference to FIG. 7. (a) of FIG. 7 is a perspective view of a jig 2C in accordance with Variation 3. (b) of FIG. 7 is a cross-sectional view illustrating the jig 2C in accordance with Variation 3, viewed along arrows B-B. Note that (b) of FIG. 7 illustrates a state where an optical element 12 and a housing 11 are placed on the jig 2C.

As illustrated in FIG. 7, the jig 2C in accordance with Variation 3 includes an L-shaped plate (first regulating section) 24, a plate spring 25, and a housing pressing section (pressing section) 26 in addition to the members of the jig 2C illustrated in FIG. 2. Members other than the L-shaped plate 24, the plate spring 25, and the housing pressing section 26 are similar, in configuration, to the respective corresponding members of the jig 2. Therefore, the members other than the L-shaped plate 24, the plate spring 25, and the housing pressing section 26 will be given respective reference signs identical to those of the respective corresponding members of the jig 2, and description of the member will be omitted.

The L-shaped plate 24 is an L-shaped plate member, and is attached to a corner of an upper end surface 23a of a columnar part 23 so as to extend along an outer edge of the upper end surface 23a of the columnar part 23. The L-shaped plate 24 is used to regulate, from two directions perpendicular to each other, movement of the optical element 12 in a direction parallel to the upper end surface 23a of the columnar part 23. The plate spring 25 is provided at a position facing the L-shaped plate 24, and elastically regulates the movement of the optical element 12 in the direction parallel to the upper end surface 23a of the columnar part 23, from a direction different from the two directions. A position of the optical element 12 on the upper end surface 23a of the columnar part 23 is automatically determined by the L-shaped plate 24 and the plate spring 25.

In a case where the jig 2 illustrated in FIG. 2 is used, it is necessary to carry out (i) a step of adjusting a position of the optical element 12 relative to the jig 2, after placing the optical element 12 on the jig 2, and further (ii) a step of adjusting a position of the housing 11 relative to the jig 2, after placing the housing 11 on the jig 2, in order to determine the position of the optical element 12 relative to the housing 11 according to a design objective. In contrast, in a case where the jig 2C in accordance with Variation 3 is used, the position of the optical element 12 relative to the jig 2C is automatically determined by the L-shaped plate 24 and the plate spring 25. Therefore, it is possible to determine the position of the optical element 12 relative to the housing 11 according to a design objective, without carrying out a step of adjusting the position of the optical element 12 relative to the jig 2C. That is, adjustment for determining the position of the optical element 12 relative to the housing 11 according to the design objective is facilitated. This causes time required to bond the optical element 12 to the housing 11 to be shorten. Furthermore, it is possible to use, as the adhesive 15, a resin which has a shorter pot life.

The housing pressing section 26 presses the housing 11 against the jig 2C. The housing pressing section 26 can be made up of a column part 26a and a plate spring 26b attached to the column part 26a (see, for example, FIG. 7). The plate spring 26b is rotatable on the column part 26a serving as a rotation axis, but a height of the plate spring 26b is fixed to a height at which an end of the plate spring 26b is pressed against a housing bottom plate 11b. After the housing 11 is placed on the jig 2C, the plate spring 26b is rotated so that the end of the plate spring 26b is pressed against the housing bottom plate 11b. This makes it possible to press the housing 11 against the jig 2C.

In a case where jig 2C in accordance with Variation 3 is used, the housing 11 is pressed against the jig 2 by, in addition to gravity acting on the housing 11, a force applied by the plate spring 26b. Therefore, even in a case where the housing 11 is pushed up by an elastic both 14 sandwiched between the optical element 12 and the housing 11, it is possible to cause an upper end surface 11a of a housing side wall 11a to be absolutely in surface contact with an upper end surface 21a of a tubular part 21. Note that a similar effect can be achieved by employing a configuration in which the housing 11 is pressed against the jig 2C with use of a weight or a configuration in which the housing 11 is pressed against the jig 2C with use of a coil spring, instead of a configuration in which the housing is pressed against the jig 2C with use of the plate spring 26b.

[Variation 4 of Jig]

Figure 8:
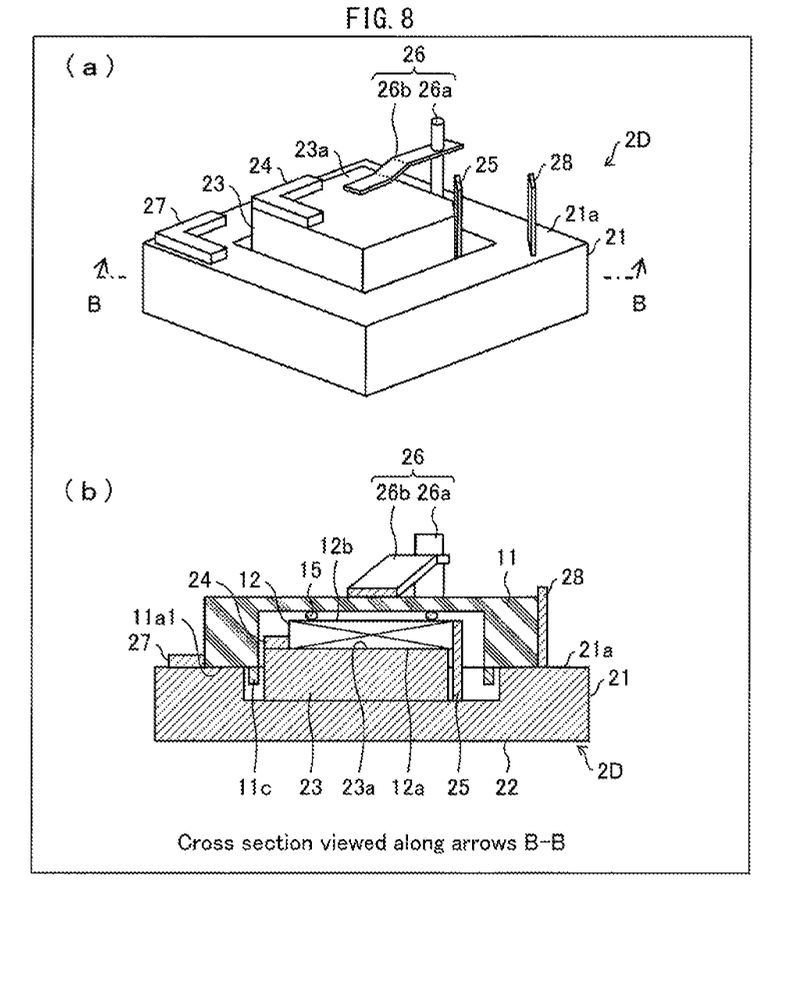

The following description will discuss Variation 4 of the jig 2 with reference to FIG. 8. (a) of FIG. 8 is a perspective view of a jig 2D in accordance with Variation 4. (b) of FIG. 8 is a cross-sectional view illustrating the jig 2D in accordance with Variation 4 viewed along arrows B-B. Note that (b) of FIG. 8. illustrates a state where an optical element 12 and a housing 11 are placed on the jig 2D.

As illustrated in FIG. 8, the jig 2D in accordance with Variation 4 includes an L-shaped plate second regulating section) 27 and a plate spring 28 in addition to the members of the jig 2C illustrated in FIG. 7. Members other than the L-shaped plate 27 and the plate spring 28 are similar, in configuration, to the respective corresponding members of the jig 2C. Therefore, the members other than the L-shaped plate 27 and the plate spring 28 will be given respective reference signs identical to those of the respective corresponding members of the jig 2C, and description of the member will be omitted.

The L-shaped plate 27 is an L-shaped plate member, and is attached to a corner of an upper end surface 21a of a tubular part 21 so as to extend along an outer edge of the upper end surface 21a of the tubular part 21. The L-shaped plate 27 is used to regulate, from two directions perpendicular to each other, movement of the housing 11 in a direction parallel to the upper end surface 21a of the tubular part 21. The plate spring 28 is provided at a position facing the L-shaped plate 27, and is used to elastically regulate, from a direction different form the two directions, the movement of the housing 11 in the direction parallel to the upper end surface 21a of the tubular part 21. A position of the housing 11 on the upper end surface 21a of the tubular part 21 is automatically determined by the L-shaped plate 27 and the plate spring 28.

In a case where the jig 2 illustrated in FIG. 2 is used, it is necessary to carry out (i) a step of adjusting a position of the optical element 12 relative to the jig 2, after placing the optical element 12 on the jig 2, and further (ii) a step of adjusting a position of the housing 11 relative to the jig 2, after placing the housing 11 on the jig 2, in order to determine the position of the optical element 12 relative to the housing 11 according to a design objective. In contrast, in a case where the jig 2D in accordance with Variation 4 is used, a position of the optical element 12 relative to the jig 2D is automatically determined by an L-shaped plate 24 and a plate spring 25. Furthermore, the position of the housing 11 relative to the jig 2D is automatically determined by the L-shaped plate 27 and the plate spring 28. Therefore, it is possible to determine the position of the optical element 12 relative to the housing 11 according to a design objective which is set in advance, without carrying out (i) a step of adjusting the position of the optical element 12 relative to the jig 2D and (ii) a step of adjusting the position of the housing 11 relative to the jig 2D. That is, adjustment for determining the position of the optical element 12 relative to the housing 11 according to the design objective is not necessary. This causes time required to bond the optical element 12 to the housing 11 to be shorten. Furthermore, it is possible to use, as an adhesive 15, a resin Which has a shorter pot life.

Note that any of the L-shaped plate 24 and the L-shaped plate 27 can be configured so as to be movable and fixable to any position within a movable range. This makes it possible to determine the position of the optical element 12 relative to the housing 11 according to the design objective which is freely set.

SUMMARY

The bonding method in accordance with the present embodiment is preferably arranged such that the first flat surface of the jig is parallel to the second flat surface of the jig.

According to the above method, it is possible to cause the front surface of the optical element to be accurately parallel to the first end surface of the side wall of the housing.

The bonding method in accordance with the present embodiment is preferable arranged such that, in the step (b), an elastic body is sandwiched between the bottom plate of the housing and the back surface of the optical element in a state where the elastic body is compressed.

According to the above method, it is possible to press the front surface of the optical element against the first flat surface of the jig by a greater force due to a restoring force of the elastic body. This allows the front surface of the optical element to be more absolutely in surface contact with the first flat surface of the jig. Therefore, it is possible to cause an angle formed between the front surface of the optical element and the first end surface of the side wall of the housing after bonding to more absolutely match an angle formed between the first flat surface of the jig and the second flat surface of the jig.

The bonding method in accordance with the present embodiment is preferably arranged such that the jig includes a columnar part and a tubular part, the columnar part having an end surface which is flat, the tubular part surrounding the columnar part and having an end surface which is flat; in the step (a), the front surface of the optical element is brought into surface contact with the end surface of the columnar part; and in the step (b), the first end surface of the side wall of the housing is brought into surface contact with the end surface of the tubular part.

Since the jig has a simple structure, it is possible to produce the jig inexpensively. Therefore, even in a case where a large number of jigs are produced, this does not result in a considerable increase in cost of producing optical modules. For this reason, in a case where a large number of optical modules are mass-produced, it is possible to produce the large number of optical modules in parallel with use of a large number of jigs. This allows an increase in amount of production of the optical modules per unit of time.

The bonding method in accordance with the present embodiment is preferably arranged such that the jig has an opening.

According to the above method, even after the housing is placed on the jig, it is possible to check, from outside the housing, a position of the optical element the housing with use of light passing through the opening (including visually checking the position of the optical element). Therefore, it is possible to adjust a position of the housing, between when the housing is placed on the jig and when an adhesive is cured, so that the position of the optical element in the housing is a desired position after bonding.

The bonding method in accordance with the present embodiment is preferably arranged such that the jig is made of a transparent material.

According to the above method, even after the housing is placed on the jig, it is possible to check, from outside the housing, the position of the optical element in the housing with use of light passing through the housing (including visually checking the position of the optical element). Therefore, it is possible to adjust the position of the housing, between when the housing is placed on the jig and when the adhesive is cured, so that the position of the optical element in the housing is a desired position after bonding.

The bonding method in accordance with the present embodiment is preferably arranged such that the jig includes a first regulating section which is provided on the first flat surface of the jig and which regulates, from at least two directions, movement of the optical element in a direction parallel to the first flat surface.

According to the above method, it is possible to determine the position of the optical element relative to the housing according to a design objective without carrying out a step of adjusting the position of the optical element relative to the jig. That is, adjustment for determining the position of the optical element relative to the housing according to the design objective is facilitated.

The bonding method in accordance with the present embodiment is preferably arranged such that the jig includes a second regulating section which is provided on the second flat surface of the jig and which regulates, from at least two directions, movement of the housing in a direction parallel to the second flat surface.

According to the above method, it is possible to determine the position of the optical element relative to the housing according to the design objective without carrying out a step of adjusting the position of the housing relative to the jig. That is, the adjustment for determining the position of the optical element relative to the housing according to the design objective is facilitated.

The bonding method in accordance with the present embodiment is preferably arranged such that the jig includes a pressing section which presses the housing against the jig.

According to the above method, the housing is pressed against the jig by, in addition to gravity acting on the housing, a force applied by the pressing section. Therefore, even in a case where the housing is pushed up by the elastic body sandwiched between the optical element and the housing, it is possible to cause the first end surface of the side wall of the housing to be absolutely in surface contact with the second flat surface.

[Supplementary Note]

The present invention is not limited to the description of the embodiments or variations above, but may be altered within the scope of the claims. An embodiment derived from a proper combination of technical means disclosed in different embodiments or variations is also encompassed in the technical scope of the present invention.

REFERENCE SIGNS LIST 1, 1A Optical module
11 Housing

11a Side wall
11a1 Upper end surface (of the side wall) (first end surface opposite to a second end surface which is joined to a bottom plate)
11b Bottom plate
11b1 Upper surface (of the bottom plate)
11c Frame part
12 Optical element
12a Front surface
12b Back surface
13 Lid
13a Frame part
13b Window part.
13b Elastic body
15 Adhesive
2, 2A, 2B, 2C, 2D Jig
21 Tubular part
21a Upper end surface (second flat surface) (of the tubular part)
22 Bottom plate
22a Opening
23 Columnar part
23a Upper end surface (first flat surface) (of the columnar part)
24 L-shaped plate (first regulating section)
25 Plate spring
26 Housing pressing section (pressing section)
27 L-shaped plate (second regulating section)
28 Plate spring

The invention claimed is:

1. A bonding method of bonding a back surface of an optical element to a bottom plate of a housing by using a jig having a first flat surface and a second flat surface, the bonding method comprising the steps of:
(a) placing the optical element on the jig so that a front surface of the optical element is in surface contact with the first flat surface of the jig;
(b) placing the housing on the jig so that (i) a first end surface of a side wall of the housing is in surface contact with the second flat surface of the jig, the first end surface being opposite to a second end surface of the side wall, the second end surface being joined to the bottom plate of the housing, and (ii) the bottom plate of the housing is in contact with the back surface of the optical element via an adhesive; and
(c) curing the adhesive after the optical element and the housing are placed on the jig,
wherein the jig includes a columnar part and a tubular part, the columnar part having an end surface which is flat, the tubular part surrounding the columnar part and having an end surface which is flat,
at step (a), the front surface of the optical element is brought into surface contact with the end surface of the columnar part,
at step (b), the first end surface of the side wall of the housing is brought into surface contact with the end surface of the tubular part,
the first end surface of the side wall of the housing is provided with a frame part made of metal, the frame part protruding from the first end surface,
a recess is defined by the columnar part and the tubular part of the jig so that, after the housing is placed on the jig, the frame part provided on the first end surface of the side wall of the housing is received within the recess and does not interfere with any one of the columnar part and the tubular part, the frame part is configured for aligning the housing relative to the optical element by inserting the frame part into the recess of the jig and aligning the housing relative to the optical element before the optical element and the housing are joined to each other via the adhesive, and
an angle formed between the first flat surface and the second flat surface of the jig is selected to match a predetermined design objective value.

2. The bonding method as set forth in claim 1, wherein the first flat surface of the jig is parallel to the second flat surface of the jig.

3. A method of producing an optical module, the method comprising the step of:
bonding a back surface of an optical element to a bottom plate of a housing by using the bonding method of claim 2.

4. The bonding method as set forth in claim 1, wherein, at step (b), an elastic body is sandwiched between the bottom plate of the housing and the back surface of the optical element, the elastic body being in a compressed state.

5. A method of producing an optical module, the method comprising the step of:
bonding a back surface of an optical element to a bottom plate of a housing by using the bonding method of claim 4.

6. The bonding method as set forth in claim 1, wherein the jig has an opening.

7. A method of producing an optical module, the method comprising the step of:
bonding a back surface of an optical element to a bottom plate of a housing by using the bonding method of claim 6.

8. The bonding method as set forth in claim 1, wherein the jig is made of a transparent material.

9. A method of producing an optical module, the method comprising the step of:
bonding a back surface of an optical element to a bottom plate of a housing by using the bonding method of claim 8.

10. The bonding method as set forth in claim 1, wherein the jig includes a first regulating section which is provided on the first flat surface of the jig and which regulates, from at least two directions, movement of the optical element in a direction parallel to the first flat surface.

11. A method of producing an optical module, the method comprising the step of:
bonding a back surface of an optical element to a bottom plate of a housing by using the bonding method of claim 10.

12. The bonding method as set forth in claim 1, wherein the jig includes a second regulating section which is provided on the second flat surface of the jig and which regulates, from at least two directions, movement of the housing in a direction parallel to the second flat surface.

13. A method of producing an optical module, the method comprising the step of:
bonding a back surface of an optical element to a bottom plate of a housing by using the bonding method of claim 12.

14. The bonding method as set forth in claim 1, wherein the jig includes a pressing section which presses the housing against the jig.

15. A method of producing an optical module, the method comprising the step of:

bonding a back surface of an optical element to a bottom plate of a housing by using the bonding method of claim 14.

16. A method of producing an optical module, the method comprising the step of:
bonding a back surface of an optical element to a bottom plate of a housing by using the bonding method of claim 1.

17. An optical module comprising:
a housing including a bottom plate;
an optical element having a back surface bonded to the bottom plate of the housing; and
an elastic body sandwiched, in a compressed state, between the bottom plate of the housing and the back surface of the optical element,
wherein the housing includes a side wall, the side wall including a first end surface located opposite to a second end surface of the side wall, the second end surface being joined to the bottom plate of the housing, and
the first end surface of the side wall of the housing is provided with a frame part made of metal, the frame part protruding from the first end surface and configured to be inserted into a recess of a jig to align the housing relative to the optical element before the optical element and the housing are joined to each other via the elastic body.

* * * * *